(12) United States Patent
Chang et al.

(10) Patent No.: US 10,586,735 B2
(45) Date of Patent: Mar. 10, 2020

(54) SEMICONDUCTOR DEVICE STRUCTURE INCLUDING HIGH VOLTAGE MOS DEVICE

(71) Applicant: United Microelectronics Corp., Hsinchu (TW)

(72) Inventors: Kai-Kuen Chang, Keelung (TW); Shih-Yin Hsiao, Chiayi County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/886,717

(22) Filed: Feb. 1, 2018

(65) Prior Publication Data
US 2018/0158738 A1 Jun. 7, 2018

Related U.S. Application Data

(62) Division of application No. 14/993,623, filed on Jan. 12, 2016, now Pat. No. 9,922,881.

(51) Int. Cl.
| | | |
|---|---|---|
| *H01L 27/088* | (2006.01) | |
| *H01L 29/423* | (2006.01) | |
| *H01L 29/08* | (2006.01) | |
| *H01L 27/092* | (2006.01) | |
| *H01L 29/78* | (2006.01) | |
| *H01L 21/8234* | (2006.01) | |

(52) U.S. Cl.
CPC ......... *H01L 21/823462* (2013.01); *H01L 21/823418* (2013.01); *H01L 21/823437* (2013.01); *H01L 27/088* (2013.01); *H01L 27/0922* (2013.01); *H01L 29/0847* (2013.01); *H01L 29/42364* (2013.01); *H01L 29/7836* (2013.01)

(58) Field of Classification Search
CPC .......... H01L 29/66659; H01L 29/0847; H01L 21/823418; H01L 21/823437; H01L 21/823462; H01L 27/088; H01L 27/0922; H01L 29/42364; H01L 29/7836
USPC ........................................................ 257/392
See application file for complete search history.

(56) References Cited

U.S. PATENT DOCUMENTS

| | | | |
|---|---|---|---|
| 7,067,365 B1 * | 6/2006 | Lee ................ | H01L 21/823418 257/E21.427 |
| 7,256,095 B2 | 8/2007 | Lin et al. | |
| 2004/0071030 A1 * | 4/2004 | Goda ................... | H01L 27/105 365/222 |
| 2004/0266113 A1 * | 12/2004 | Kirkpatrick ....... | H01L 21/26506 438/275 |
| 2005/0067659 A1 * | 3/2005 | Gutsche ............ | H01L 21/28273 257/390 |

(Continued)

OTHER PUBLICATIONS

Ogura et al., "Design and Characteristics of the Lightly Doped Drain-Source (LDD) Insulated Gate Field-Effect Transistor", IEEE Transactions on Electron Devices, vol. ED-27, No. 8, Aug. 1980.*

*Primary Examiner* — Duy T Nguyen
(74) *Attorney, Agent, or Firm* — J.C. Patents

(57) ABSTRACT

A method for fabricating a semiconductor device structure is shown. A gate dielectric layer is formed on a substrate. A portion of the gate dielectric layer, which is located on a part of the substrate in which an S/D region is to be formed, is removed. A gate electrode is formed on the remaining gate dielectric layer. A spacer is formed on the sidewall of the gate electrode and the sidewall of the gate dielectric layer. The S/D region is then formed in the part of the substrate beside the spacer.

9 Claims, 2 Drawing Sheets

(56) References Cited

U.S. PATENT DOCUMENTS

| | | | |
|---|---|---|---|
| 2006/0163678 A1* | 7/2006 | Anezaki | H01L 27/1052 257/411 |
| 2011/0133276 A1 | 6/2011 | Thei et al. | |
| 2013/0270635 A1* | 10/2013 | Parris | H01L 29/66659 257/336 |
| 2014/0167144 A1 | 6/2014 | Tsuchiko | |

* cited by examiner

SEMICONDUCTOR DEVICE STRUCTURE INCLUDING HIGH VOLTAGE MOS DEVICE

CROSS-REFERENCE TO RELATED APPLICATION

This application is a divisional application of and claims the priority benefit of U.S. application Ser. No. 14/993,623, filed on Jan. 12, 2016, now allowed. The entirety of the above-mentioned patent application is hereby incorporated by reference herein and made a part of this specification.

BACKGROUND OF THE INVENTION

Field of Invention

This invention relates to a semiconductor process, and particularly relates to a method for fabricating a semiconductor device structure, and to a semiconductor device structure that can be formed with the same method.

Description of Related Art

Some kinds of integrated circuits include high-voltage (HV) MOS devices, such as Input/Output (JO) devices, for high-voltage operations. Since the operation voltage is high, an HV device requires a thick gate oxide layer.

However, the thick gate oxide layer is so thick that the uniformity of the shallow source/drain (S/D) junction formed by ion implantation through the gate oxide layer is reduced, so that the variation of breakdown voltage of the HV device is large.

SUMMARY OF THE INVENTION

Accordingly, this invention provides a method for fabricating a semiconductor device structure, which is capable of reducing the variation of the breakdown voltage of an HV MOS device.

This invention also provides a semiconductor device structure that can be formed with the fabrication method of this invention.

The fabrication method of this invention is described below. A first gate dielectric layer is formed on a substrate. A portion of the first gate dielectric layer, which is located on a part of the substrate in which a first S/D region is to be formed, is removed. A first gate electrode is formed on the remaining first gate dielectric layer. A spacer is formed on the sidewall of the first gate electrode and the sidewall of the remaining first gate dielectric layer. The first S/D region is then formed in the part of the substrate beside the first spacer. The first gate dielectric layer, the first gate electrode, the first spacer and the first S/D region belong to a first MOS device.

The semiconductor device structure of this invention includes a first gate dielectric layer on a substrate, a first gate electrode on the first gate dielectric layer, a first spacer on the sidewall of the first gate electrode and the sidewall of the first gate dielectric layer, and a first S/D region in the substrate beside the first spacer.

In an embodiment, the first MOS device is a high-voltage device.

In an embodiment, the first MOS device is formed simultaneously with a second MOS device that comprises a second gate dielectric layer, a second gate electrode, a second spacer and a second source/drain region. It is possible that the first MOS device is an HV device and the second MOS device a low-voltage (LV) device.

As this invention is applied to an HV MOS device, since the portion of the thick gate dielectric layer that is located on the part of the substrate to be formed with the first S/D region therein is removed in advance, the implantation of the first S/D region does not pass through the thick gate dielectric layer, so that the uniformity of the shallow S/D junction is reduced and the variation of breakdown voltage of the HV device is reduced.

In order to make the aforementioned and other objects, features and advantages of the present invention comprehensible, a preferred embodiment accompanied with figures is described in detail below.

DESCRIPTION OF EMBODIMENTS

This invention will be further explained with the following embodiment and the accompanying drawings, which are not intended to restrict the scope of this invention. For example, although in the illustrated embodiment the first MOS device is an HV device that is formed simultaneously with a second MOS device being an LV device, this invention can also be applied to a case where the first MOS device is another kind of MOS device whose gate dielectric layer would affect the uniformity of the S/D junctions thereof, or a case forming only HV devices.

Figure 4:
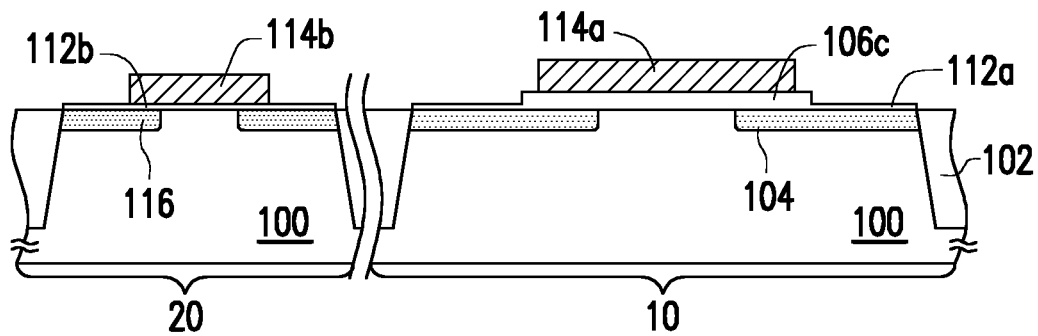
Figure 5:
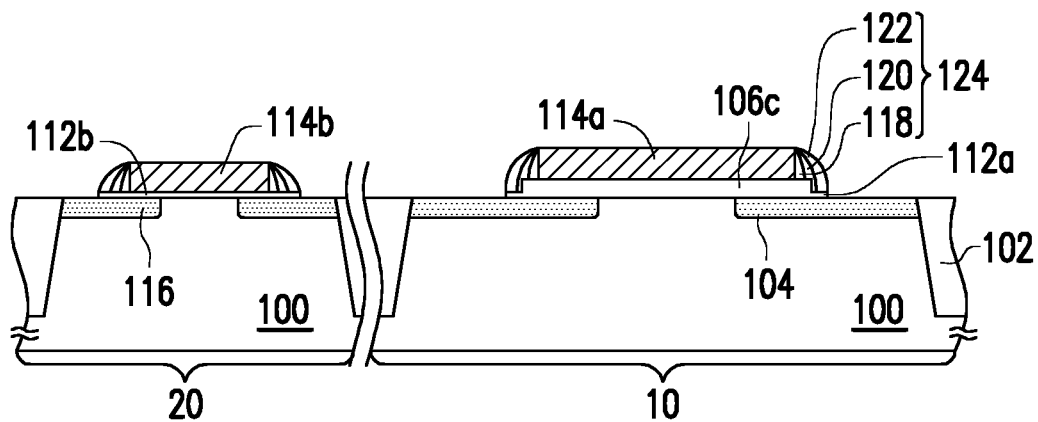
Figure 6:
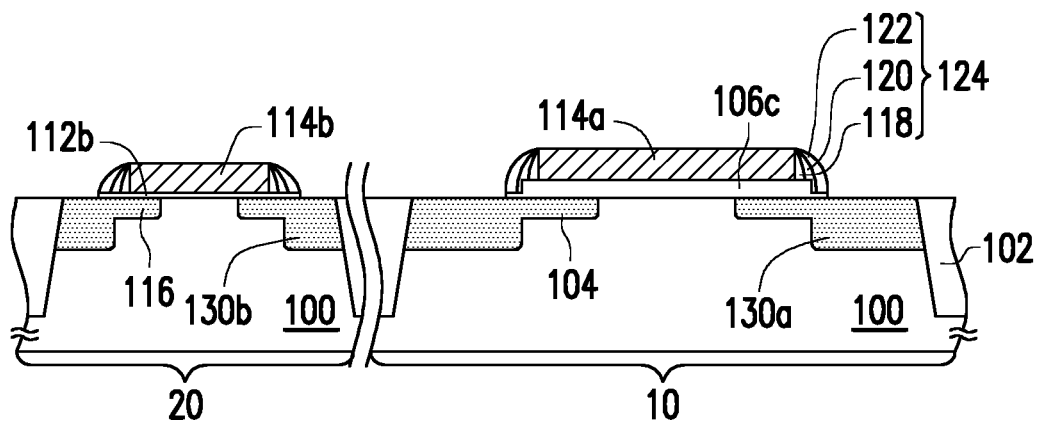

FIGS. 1, 2, 3, 4, 5 and 6 illustrate, in a cross-sectional view, a method for fabricating a semiconductor device structure according to an embodiment of this invention, wherein FIG. 6 also illustrates the structure of the semiconductor device structure according to the embodiment. FIG. 2A illustrates, in a top view, a local structure of the patterned mask layer used in the step illustrated in FIG. 2, wherein the local structure is in the area of the first MOS device as a HV device.

Figure 1:
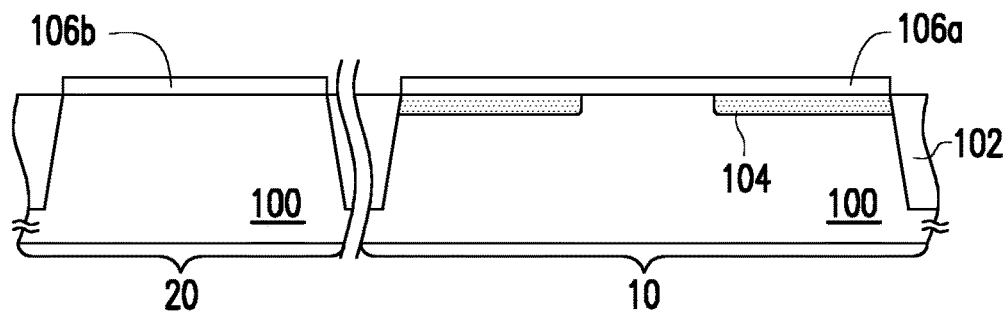
FIGS. 1, 2, 3, 4, 5 and 6 illustrate, in a cross-sectional view, a method for fabricating a semiconductor device structure according to an embodiment of this invention, wherein FIG. 6 also illustrates the structure of the semiconductor device structure according to the embodiment.

Referring to FIG. 1, a semiconductor substrate 100 is provided, having a first area 10 for an HV MOS device and a second area 20 for an LV MOS device, and having an isolation structure 102 therein. It is possible that the HV device is an input/output (JO) device and the LV device is a core device.

Source/drain extension regions 104 of the HV MOS device are formed in the substrate 100 in the first area 10, using a correspondingly patterned mask layer (not shown). A thick gate dielectric layer 106a of the HV device is then formed on the substrate 100 in the first area 10, while a dielectric layer 106b of the same material and thickness is formed on the substrate 100 in the second area 20. To match the high operation voltage, the thick gate dielectric layer 106a of the HV device has a thickness of, for example, 100 to 1200 angstroms. The gate dielectric layer 106a may include a gate oxide layer, for example.

Figure 2:
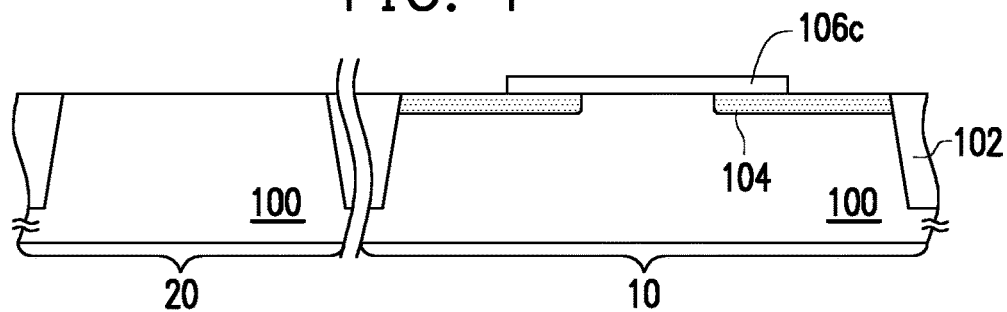
Figure 2A:
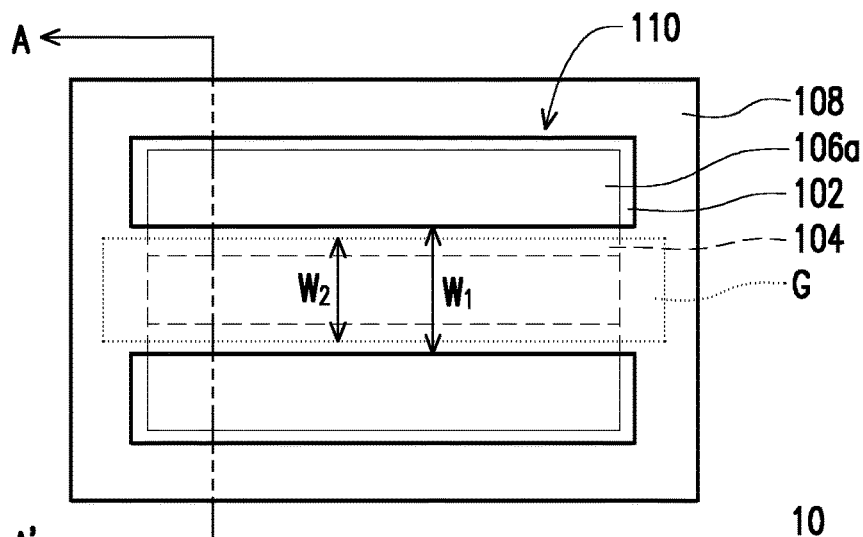
FIG. 2A illustrates, in a top view, a local structure of the patterned mask layer used in the step illustrated in FIG. 2.

Referring to FIGS. 2 and 2A, the gate dielectric layer 106a of the HV device is patterned to remove a portion thereof that is located on a part of the substrate 100 in which the source/drain regions of the HV device are to be formed, while the dielectric layer 106b in the second area 20 for the LV device is entirely removed.

The mask pattern for patterning the gate dielectric layer 106a is designed such that the remaining gate dielectric layer 106c has a width larger than that of the gate electrode to be formed later. As shown in FIG. 2A with line A-A' corresponding to the cross section view of FIG. 2, the patterned mask layer 108 is designed to have openings 110 therein exposing the portions of the gate dielectric layer 106a to be removed, and the portion of the gate dielectric layer 106a covered by the patterned mask layer 108, i.e., the portion to be made into the patterned gate dielectric layer 106c later, has a width $W_1$ larger than the predetermined width $W_2$ of the gate electrode G to be formed later.

Figure 3:
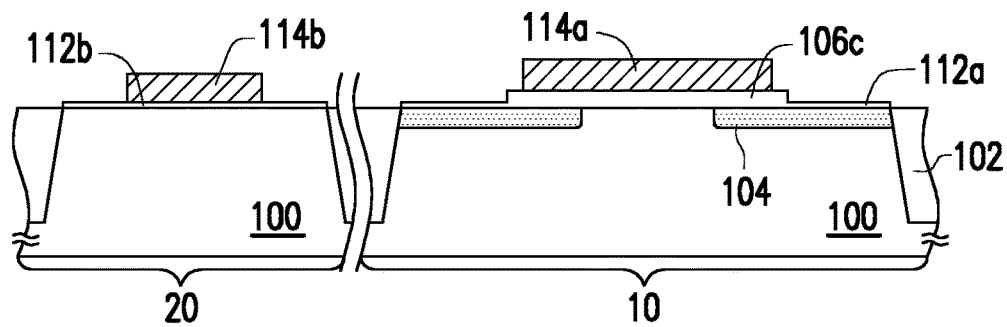

Referring to FIG. 3, a thin gate dielectric layer 112b of the LV device is then formed on the substrate 100 in the second area 20 for the LV device, while a thin dielectric layer 112a of the same material and thickness is formed on the substrate 100 in the first area 10 for the HV device. The thin gate dielectric layer 112b of the LV device has a thickness of, for example, 15 to 100 angstroms. The gate dielectric layer 112b may include a gate oxide layer, for example.

Thereafter, a gate electrode 114a of the HV device is formed on the thick gate dielectric layer 106c in the first area 10 for the HV device, while a gate electrode 114b of the same material and thickness of the LV device is formed on the thin gate dielectric layer 112b in the second area 20 for the LV device. The material of the gate electrodes 114a and 114b may be doped polysilicon, for example.

Referring to FIG. 4, S/D extension regions 116 of the LV device are formed in the substrate 100 beside the gate electrode 114b of the LV device in the second area 20, using a patterned mask layer (not shown) covering the first area 10 for the HV device.

Referring to FIG. 5, a spacer 124 is formed on the sidewall of the gate electrode 114a of the HV device and the sidewall of the thick gate dielectric layer 106c in the first area 10, and also on the sidewall of the gate electrode 114b of the LV device in the second area 20. The spacer 124 may be, for example, an ONO composite spacer that includes a silicon oxide layer 118 nearest to the sidewall of the gate electrode 114a or 114b, a silicon nitride layer 120 on the sidewall of the silicon oxide layer 118, and another silicon oxide layer 122 on the sidewall of the silicon nitride layer 120. A cleaning treatment may be performed then for the process of the spacer 124, wherein the thin gate dielectric layer 112b not covered by the gate electrode 114b and the spacer 124 in the second area 20 and the thin dielectric layer 112a not covered by the spacer 124 in the first area 10 may be removed, as shown in FIG. 5.

Referring to FIG. 6, S/D regions 130a of the HV device are formed, with ion implantation, in the substrate 100 beside the spacer 124 in the first area 10 for the HV device, while S/D regions 130b of the LV device are formed in the same manner in the substrate 100 beside the spacer 124 in the second area 20 for the LV device.

Since the portion of the thick gate dielectric layer 106a that is located on the part of the substrate to be formed with the S/D regions 130a of the HV device therein is removed in advance, the ion implantation of the S/D regions 130a of the HV device does not pass through the thick gate dielectric layer 106a, so that the uniformity of the shallow S/D junction of the HV device is reduced and the variation of the breakdown voltage of the HV device is reduced.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A semiconductor device structure, comprising:
   a first gate dielectric layer on a substrate;
   a thin dielectric layer integrally connected with the first gate dielectric layer, wherein the thin dielectric layer is thinner in thickness than the first gate dielectric layer;
   a first gate electrode on the first gate dielectric layer;
   a first spacer on a sidewall of the first gate electrode and a sidewall of the first gate dielectric layer;
   a first source/drain region in the substrate beside the first spacer; and
   a second MOS device that comprises:
   a second gate dielectric layer, which is thinner than the first gate dielectric layer;
   a second gate electrode on the second gate dielectric layer;
   a second spacer on a sidewall of the second gate electrode; and
   a second source/drain region in the substrate beside the second spacer,
   wherein the first spacer is same as the second spacer, and the first spacer and the second spacer are both ONO composite spacers, comprising of a silicon oxide layer, a silicon nitride layer, and an another silicon oxide layer,
   wherein the first gate dielectric layer, the first gate electrode, the first spacer and the first source/drain region belong to a first MOS device, and a top surface of the first gate dielectric layer is completely covered by the first spacer,
   wherein the first spacer comprises a first bottom surface laterally aside the sidewall of the first gate dielectric layer, and a second bottom surface on the top surface of the first gate dielectric layer, the first bottom surface of the first spacer is higher than a bottom surface of the first gate dielectric layer; and
   wherein the first bottom surface of the first spacer is disposed on and in direct contact with the thin dielectric layer, and is lower than the second bottom surface of the first spacer,
   wherein the first gate electrode comprises a top surface not covered by the first spacer.

2. The semiconductor device structure of claim 1, wherein a width of the first gate dielectric layer is larger than a width of the first gate electrode.

3. The semiconductor device structure of claim 1, wherein the first gate dielectric layer comprises a gate oxide layer.

4. The semiconductor device structure of claim 1, further comprising, in the substrate, a source/drain extension region connected to the first source/drain region.

5. The semiconductor device structure of claim 1, wherein the first MOS device is a high-voltage device.

6. The semiconductor device structure of claim 1, further comprising:
   a first source/drain extension region connected to the first source/drain region, in the substrate of the first MOS device; and
   a second source/drain extension region connected to the second source/drain region, in the substrate of the second MOS device.

7. The semiconductor device structure of claim 1, wherein the first MOS device is a high-voltage device and the second MOS device is a low-voltage device.

8. The semiconductor device structure of claim 7, wherein the high-voltage device is an input/output (TO) device and the low-voltage device is a core device.

9. The semiconductor device structure of claim 1, wherein the thin dielectric layer has a thickness of 15 to 100 angstroms.

* * * * *